United States Patent
Song et al.

(10) Patent No.: US 9,054,650 B2
(45) Date of Patent: Jun. 9, 2015

(54) BIAS CIRCUIT AND POWER AMPLIFIER WITH SELECTION FUNCTION OF POWER MODE

(71) Applicant: SAMSUNG ELECTRO-MECHANICS CO., LTD., Suwon, Gyunggi-do (KR)

(72) Inventors: Young-Jean Song, Gyunggi-do (KR); Myeong Woo Han, Gyunggi-do (KR); Jun Goo Won, Gyunggi-do (KR); Shinichi Iizuka, Gyunggi-do (KR); Youn Suk Kim, Gyunggi-do (KR); Ki Joong Kim, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 72 days.

(21) Appl. No.: 14/035,924

(22) Filed: Sep. 24, 2013

(65) Prior Publication Data

US 2015/0002224 A1  Jan. 1, 2015

(30) Foreign Application Priority Data

Jun. 28, 2013  (KR) .................. 10-2013-0076062

(51) Int. Cl.
  *H03F 3/04*  (2006.01)
  *H03F 1/30*  (2006.01)
  *H03F 3/21*  (2006.01)
(52) U.S. Cl.
  CPC . *H03F 1/301* (2013.01); *H03F 3/21* (2013.01)
(58) Field of Classification Search
  CPC .................. H03F 3/04; H03G 3/30
  USPC ......................... 330/289, 285, 296
  See application file for complete search history.

(56) References Cited

U.S. PATENT DOCUMENTS

| | | | |
|---|---|---|---|
| 7,400,202 B2 * | 7/2008 | Yamamoto et al. | 330/296 |
| 7,504,887 B2 | 3/2009 | Masuda et al. | |
| 8,228,122 B1 * | 7/2012 | Yuen et al. | 330/289 |
| 8,704,598 B2 * | 4/2014 | Kobayashi | 330/294 |
| 2007/0236293 A1 | 10/2007 | Masuda et al. | |
| 2009/0212863 A1 | 8/2009 | Ishimaru | |
| 2014/0139291 A1 * | 5/2014 | Won et al. | 330/289 |

FOREIGN PATENT DOCUMENTS

| | | |
|---|---|---|
| JP | 2007-306543 A | 11/2007 |
| JP | 2009-200770 A | 9/2009 |

* cited by examiner

*Primary Examiner* — Henry Choe
(74) *Attorney, Agent, or Firm* — McDermott Will & Emery LLP (57) ABSTRACT

There are provided a bias circuit and a power amplifier. The bias circuit includes a first temperature compensating unit connected between an operating voltage terminal and a ground and operating according to a reference voltage to generate a turn-on voltage, a second temperature compensating unit connected between a reference voltage terminal and the ground and operating according to the turn-on voltage to generate a control voltage, a power mode selecting unit selecting one of a high power mode and a low power mode and providing an additional current to the first temperature compensating unit at the time of selecting the low power mode to increase the turn-on voltage, and a bias voltage generating unit generating a bias voltage according to the control voltage, wherein the control voltage and the bias voltage are decreased according to the increase in the turn-on voltage.

32 Claims, 6 Drawing Sheets

BIAS CIRCUIT AND POWER AMPLIFIER WITH SELECTION FUNCTION OF POWER MODE

CROSS-REFERENCE TO RELATED APPLICATION

This application claims the priority of Korean Patent Application No. 10-2013-0076062 filed on Jun. 28, 2013, in the Korean Intellectual Property Office, the disclosure of which is incorporated herein by reference.

BACKGROUND OF THE INVENTION

1. Field of the Invention

The present invention relates to a bias circuit and a power amplifier with a power mode selection function, which may be applied to a wireless communications system.

2. Description of the Related Art

In general, a wireless communications scheme is a digital modulation/demodulation scheme, and an appropriate scheme has been employed in consideration of improvements in frequency utilization efficiency. For instance, a quadrature phase shift keying (QPSK) scheme is employed for a mobile telephone using a code division multiple access (CDMA) scheme, and a digital modulation scheme of an orthogonal frequency division multiplexing (OFDM) scheme is employed in a wireless LAN conforming to the institute of electrical and electronics engineers (IEEE) 802.11 standard.

A wireless communications system in which such wireless communications schemes are employed includes a power amplifier for amplifying the power of a transmission signal.

Here, in a system requiring linear amplification, a power amplifier which has a linear characteristic for amplifying the transmission signal without distortion is required. Here, the linear characteristic indicates that the power of an output signal is amplified at a constant rate while the phase thereof is not changed, even when the power of an input signal may vary.

In addition, in a wireless communications apparatus, in order to increase a usage time thereof within a limited battery capacity, technology for significantly reducing power consumption in components to thereby increase efficiency is needed.

In a typical power amplifier, a bias voltage generated by a bias circuit is supplied to a power amplifying element through a resistor. In this case, the bias circuit may include a temperature compensation function.

However, since the above-mentioned typical power amplifier provides a constant bias voltage after being designed, a high power mode or a low power mode may not be able to be selected as necessary. Therefore, it may be difficult to take an appropriate action for transmission power required for device characteristics or the communications environment of a wireless communications system to which such an amplifier is applied.

The Related Art Document relates to a power amplifier, but does not disclose a technical feature allowing for a high power mode or a low power mode to be selected in order to decrease power consumption.

RELATED ART DOCUMENT

Japanese Patent Laid-Open Publication No. 2009-200770

SUMMARY OF THE INVENTION

An aspect of the present invention provides a bias circuit and a power amplifier capable of selecting a required mode between a high power mode and a low power mode and decreasing a control voltage and a bias voltage by providing an additional current to a temperature compensation circuit in the low power mode to increase a turn-on voltage.

According to an aspect of the present invention, there is provided a bias circuit, including: a first temperature compensating unit connected between an operating voltage terminal and a ground and operating according to a reference voltage to generate a turn-on voltage; a second temperature compensating unit connected between a reference voltage terminal and the ground and operating according to the turn-on voltage to generate a control voltage; a power mode selecting unit selecting one of a high power mode and a low power mode according to a power mode voltage and providing an additional current to the first temperature compensating unit at the time of selecting the low power mode to increase the turn-on voltage; and a bias voltage generating unit generating a bias voltage according to the control voltage, wherein the control voltage and the bias voltage are decreased according to the increase in the turn-on voltage.

According to another aspect of the present invention, there is provided a bias circuit, including: a first temperature compensating unit connected between an operating voltage terminal and a ground and operating according to a reference voltage to generate a turn-on voltage; a second temperature compensating unit connected between a reference voltage terminal and the ground and operating according to the turn-on voltage to generate a control voltage; a power mode selecting unit selecting one of a high power mode and a low power mode according to a power mode voltage; and a bias voltage generating unit generating a bias voltage according to the control voltage, wherein the power mode selecting unit separates a path of the additional current at the time of selecting the high power mode and connects the path of the additional current at the time of selecting the low power mode to thereby provide the additional current to the first temperature compensating unit to increase the turn-on voltage, and the control voltage and the bias voltage are decreased according to the increase in the turn-on voltage.

The first temperature compensating unit may include: a first temperature compensating transistor having a collector connected to the operating voltage terminal, a base, and an emitter; and a first resistor connected between the emitter of the first temperature compensating transistor and the ground to provide the turn-on voltage.

The second temperature compensating unit may include: a second resistor having one end connected to the reference voltage terminal and the other end connected to the base of the first temperature compensating transistor; and a second temperature compensating transistor having a collector connected to the other end of the second resistor, a base connected to the emitter of the first temperature compensating transistor to receive the turn-on voltage, and an emitter connected to the ground.

The second temperature compensating unit may further include a capacitor connected between the collector of the second temperature compensating transistor and the ground.

The power mode selecting unit may include: a switching transistor having a collector connected to the operating voltage terminal, a base receiving the power mode voltage, and an emitter; and a current adjusting resistor connected between the emitter of the switching transistor and the emitter of the first temperature compensating transistor to adjust the additional current.

The bias voltage generating unit may include: a bias generating transistor having a collector connected to the operating voltage terminal, a base connected to the base of the first temperature compensating transistor, and an emitter connected to an output terminal of the bias voltage generating unit; and a capacitor connected between the base of the bias generating transistor and the ground.

According to another aspect of the present invention, there is provided a power amplifier, including: a first temperature compensating unit connected between an operating voltage terminal and a ground and operating according to a reference voltage to generate a turn-on voltage; a second temperature compensating unit connected between a reference voltage terminal and the ground and operating according to the turn-on voltage to generate a control voltage; a power mode selecting unit selecting one of a high power mode and a low power mode according to a power mode voltage and providing an additional current to the first temperature compensating unit at the time of selecting the low power mode to increase the turn-on voltage; a bias voltage generating unit generating a bias voltage according to the control voltage; and an amplifying unit receiving a bias voltage from the bias voltage generating unit to amplify power of a transmission signal, wherein the first temperature compensating unit provides the turn-on voltage temperature-compensated to compensate for a temperature change in the bias voltage generating unit and the second temperature compensating unit provides the control voltage temperature-compensated to compensate for a temperature change in the amplifying unit, and the control voltage and the bias voltage are decreased according to the increase in the turn-on voltage.

According to another aspect of the present invention, there is provided a power amplifier, including: a first temperature compensating unit connected between an operating voltage terminal and a ground and operating according to a reference voltage to generate a turn-on voltage; a second temperature compensating unit connected between a reference voltage terminal and the ground and operating according to the turn-on voltage to generate a control voltage; a power mode selecting unit selecting one of a high power mode and a low power mode according to a power mode voltage; a bias voltage generating unit generating a bias voltage according to the control voltage, and an amplifying unit receiving a bias voltage from the bias voltage generating unit to amplify power of a transmission signal, wherein the power mode selecting unit separates a path of the additional current at the time of selecting the high power mode and connects the path of the additional current at the time of selecting the low power mode to thereby provide the additional current to the first temperature compensating unit to increase the turn-on voltage, and the control voltage and the bias voltage are decreased according to the increase in the turn-on voltage.

According to another aspect of the present invention, there is provided a power amplifier, including: a first temperature compensating unit connected between an operating voltage terminal and a ground and operating according to a reference voltage to generate a turn-on voltage; a second temperature compensating unit connected between a reference voltage terminal and the ground and operating according to the turn-on voltage to generate a control voltage; a power mode selecting unit selecting one of a high power mode and a low power mode according to a power mode voltage; a bias voltage generating unit generating a bias voltage according to the control voltage, and an amplifying unit receiving a bias voltage from the bias voltage generating unit to amplify power of a transmission signal, wherein the first temperature compensating unit provides the turn-on voltage temperature-compensated to compensate for a temperature change in the bias voltage generating unit and the second temperature compensating unit provides the control voltage temperature-compensated to compensate for a temperature change in the amplifying unit, the power mode selecting unit separates a path of the additional current at the time of selecting the high power mode and connects the path of the additional current at the time of selecting the low power mode to thereby provide the additional current to the first temperature compensating unit to increase the turn-on voltage, and the control voltage and the bias voltage are decreased according to the increase in the turn-on voltage.

The first temperature compensating unit may include: a first temperature compensating transistor having a collector connected to the operating voltage terminal, a base, and an emitter; and a first resistor connected between the emitter of the first temperature compensating transistor and the ground to provide the turn-on voltage.

The second temperature compensating unit may include: a second resistor having one end connected to the reference voltage terminal and the other end connected to the base of the first temperature compensating transistor; and a second temperature compensating transistor having a collector connected to the other end of the second resistor, a base connected to the emitter of the first temperature compensating transistor to receive the turn-on voltage, and an emitter connected to the ground.

The power mode selecting unit may include: a switching transistor having a collector connected to the operating voltage terminal, a base receiving the power mode voltage, and an emitter; and a current adjusting resistor connected between the emitter of the switching transistor and the emitter of the first temperature compensating transistor to adjust the additional current.

The bias voltage generating unit may include: a bias generating transistor having a collector connected to the operating voltage terminal, a base connected to the base of the first temperature compensating transistor, and an emitter connected to an output terminal of the bias voltage generating unit; and a capacitor connected between the base of the bias generating transistor and the ground.

The amplifying unit may include an amplifying transistor having a base connected to an output node of the bias voltage generating unit through a bias resistor and receiving an input signal, a collector outputting an amplified signal, and an emitter connected to the ground, and the first temperature compensating transistor compensates for temperature characteristic of the bias generating transistor and the second temperature compensating transistor compensates for temperature characteristic of the amplifying transistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Throughout the drawings, the same or like reference numerals will be used to designate the same or like elements.

Figure 1:
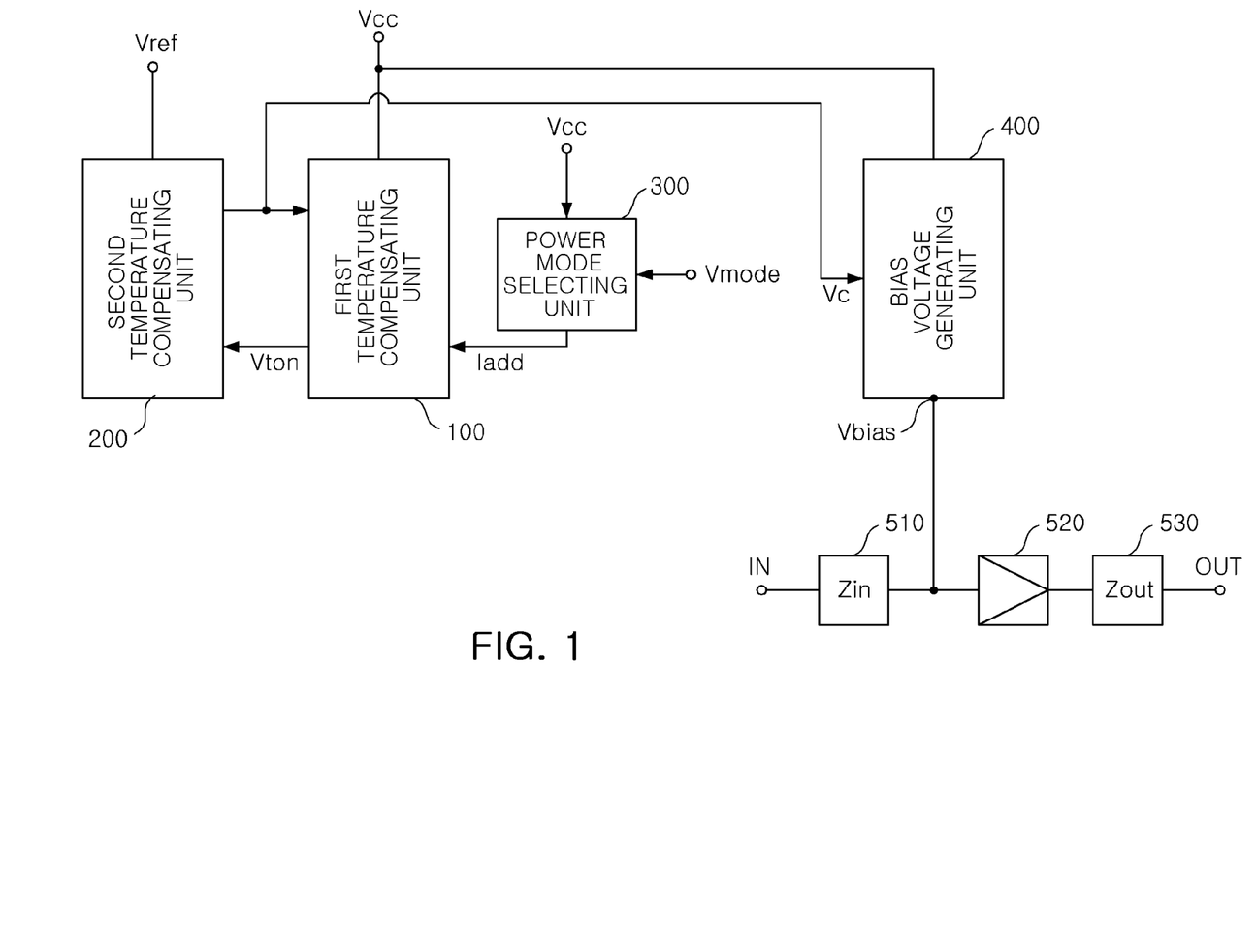
FIG. 1 is a block diagram of a bias circuit and a power amplifier according to an embodiment of the present invention.

FIG. 1 is a block diagram of a bias circuit and a power amplifier according to an embodiment of the present invention. Referring to FIG. 1, the bias circuit according to the embodiment of the present invention may include a first temperature compensating unit 100, a second temperature compensating unit 200, a power mode selecting unit 300, and a bias voltage generating unit 400.

The power amplifier according to the embodiment of the present invention may include the first temperature compensating unit 100, the second temperature compensating unit 200, the power mode selecting unit 300, the bias voltage generating unit 400, and an amplifying unit 520.

In addition, the power amplifier may include an input matching unit 510 connected to an input terminal of the amplifying unit 520 and an output matching unit 530 connected to an output terminal of the amplifying unit 520.

The first temperature compensating unit 100 is connected between an operating voltage Vcc terminal and a ground to thereby be operated according to a reference voltage Vref, generate a turn-on voltage Vton and provide the generated turn-on voltage Vton to the second temperature compensating unit 200.

The second temperature compensating unit 200 is connected between a reference voltage Vref terminal and a ground to thereby be operated according to the turn-on voltage Vton, generate a control voltage Vc and provide the generated control voltage Vc to the first temperature compensating unit 100 and the bias voltage generating unit 400.

The power mode selecting unit 300 selects one of a high power mode and a low power mode according to a power mode voltage Vmode and provides an additional current Iadd to the first temperature compensating unit 100 at the time of selecting the low power mode, such that it may increase the turn-on voltage Vton.

The bias voltage generating unit 400 may generate a bias voltage Vbias according to the control voltage Vc.

In addition, the amplifying unit 520 may receive the bias voltage Vbias from the bias voltage generating unit 400 to amplify power of a transmission signal input through the input matching unit 510 and provide the amplified power to the output matching unit 530.

Meanwhile, the first temperature compensating unit 100 may provide the turn-on voltage Vton temperature-compensated to compensate for a temperature change in the bias voltage generating unit 400, and the second temperature compensating unit 200 may provide the control voltage Vc temperature-compensated to compensate for a temperature change in the amplifying unit 520.

In addition, the power mode selecting unit 300 may separate a path of the additional current Iadd therefrom at the time of selecting the high power mode.

The power mode selecting unit 300 may connect the path of the additional current Iadd thereto and provide the additional current Iadd to the first temperature compensating unit 100 at the time of selecting the low power mode to thereby increase the turn-on voltage Vton.

For example, when the turn-on voltage Vton is increased, the control voltage Vc and the bias voltage Vbias are decreased. A detailed description thereof will be provided below.

Figure 2:
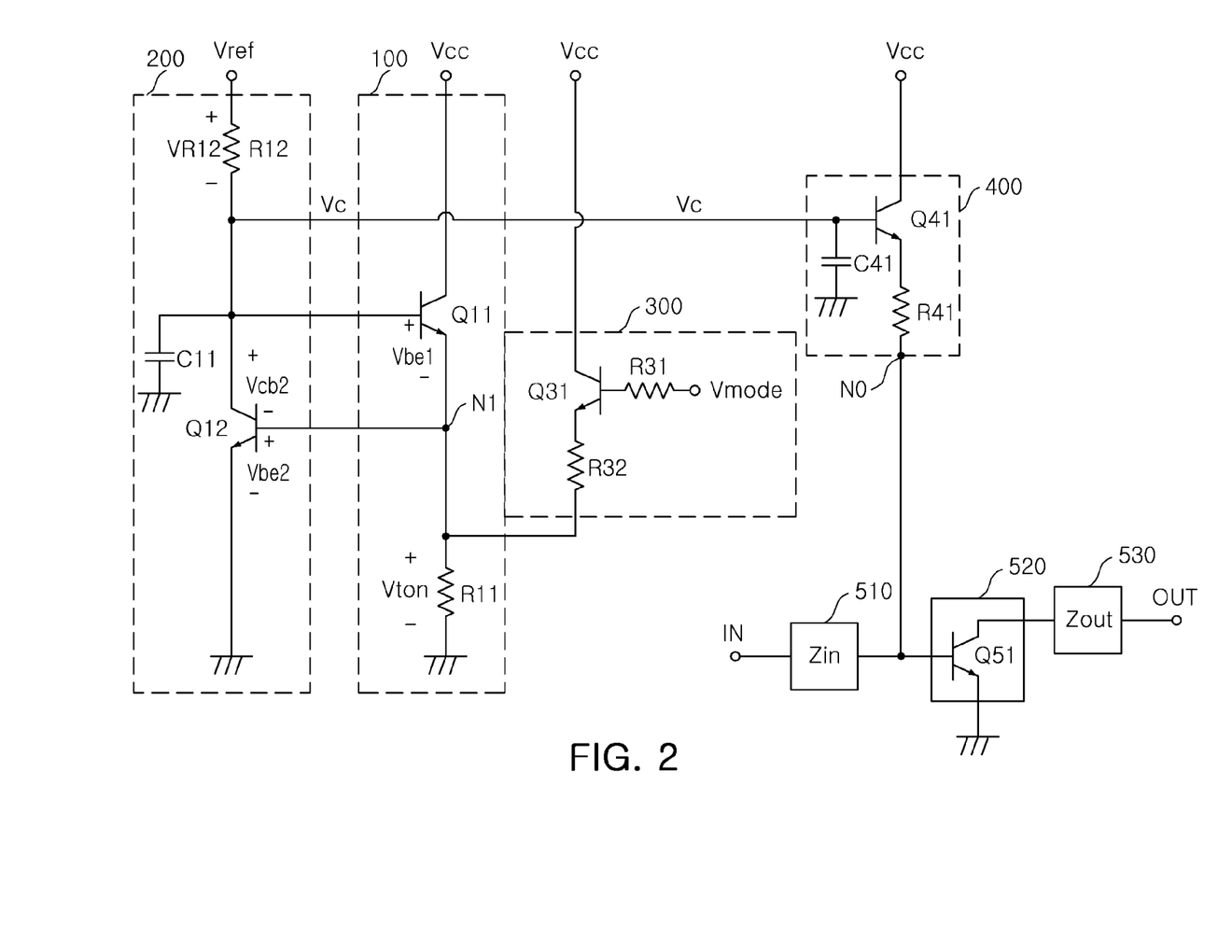
FIG. 2 is a circuit diagram of the bias circuit and the power amplifier according to the embodiment of the present invention.

FIG. 2 is a circuit diagram of the bias circuit and the power amplifier according to the embodiment of the present invention. In a description referring to FIG. 2, the same content as that described with reference to FIG. 1 will be omitted because a description thereof is overlapped.

Referring to FIGS. 1 and 2, the first temperature compensating unit 100 may include a first temperature compensating transistor Q11 and a first resistor R11.

The first temperature compensating transistor Q11 may include a collector connected to the operating voltage Vcc terminal, a base receiving the control voltage Vc, and an emitter connected to the first resistor R11.

The first resistor R11 may be connected between the emitter of the first temperature compensating transistor Q11 and a ground to provide the turn-on voltage Vton to the second temperature compensating unit 200.

The second temperature compensating unit 200 may include a second resistor R12 and a second temperature compensating transistor Q12.

The second resistor R12 may include one end connected to the reference voltage Vref terminal and the other end connected to the base of the first temperature compensating transistor Q11.

The second temperature compensating transistor Q12 may include a collector connected to the other end of the second resistor R12, a base connected to the emitter of the first temperature compensating transistor to receive the turn-on voltage Vton, and an emitter connected to the ground.

The second temperature compensating unit 200 may further include a capacitor C11 connected between the collector of the second temperature compensating transistor Q12 and the ground. The capacitor C11 may remove an alternating current noise included in the control voltage Vc.

As described above, the power mode selecting unit 300 may include a semiconductor switch element for separating the path of the additional current Iadd therefrom at the time of selecting the high power mode and connecting the path of the additional current Iadd thereto at the time of selecting the low power mode.

In this case, examples of the semiconductor switch element may include a known semiconductor element such as a switching transistor, a switching diode, a thyristor, or the like, and one implementation example describes the switching transistor below, but the present invention is not limited thereto.

The power mode selecting unit 300 may include a switching transistor Q31 and a current adjusting resistor R32.

The switching transistor Q31 may include a collector connected to the operating voltage Vcc, a base receiving the power mode voltage Vmode through a resistor R31, and an emitter connected to the current adjusting resistor R32.

The current adjusting resistor R32 may be connected between the emitter of the switching transistor Q31 and the emitter of the first temperature compensating transistor Q11 to adjust the additional current Iadd. For example, in the low power mode, since the current adjusting resistor R32 and the first resistor R11 are present from the operating voltage Vcc terminal to the ground, the additional current Iadd may be varied by varying a resistance value of the current adjusting resistor R32.

The bias voltage generating unit 400 may include a bias generating transistor Q41 and a capacitor C41.

The bias generating transistor Q41 may include a collector connected to the operating voltage Vcc terminal, a base connected to the base of the first temperature compensating transistor Q11, and an emitter connected to an output terminal No of the bias voltage generating unit.

The capacitor C41 may be connected between the base of the bias generating transistor Q41 and a ground and may remove the alternating current noise included in the control voltage Vc.

The amplifying unit may include an amplifying transistor Q51. The amplifying transistor Q51 may include a base connected to an output node of the bias voltage generating unit through a bias resistor and receiving an input signal, a collector outputting an amplified signal, and an emitter connected to the ground.

In this case, the input matching unit 510 performs impedance matching at the input terminal of the amplifying unit 520, such that a signal input via an input terminal IN is transmitted to the amplifying unit 520 losslessly. In addition, the output matching unit 530 performs impedance matching at the output of the amplifying unit 520, such that a signal output from the amplifying unit 520 is transmitted to the output terminal OUT losslessly.

In addition, the first temperature compensating transistor Q11 may compensate for temperature characteristics of the bias generating transistor Q41 and the second temperature compensating transistor Q12 may compensate for temperature characteristics of the amplifying transistor Q51.

Meanwhile, referring to FIGS. 1 and 2, the power mode selecting unit 300 may select the low power mode or the high power mode according to the power mode voltage Vmode.

For example, the power mode voltage Vmode may become a voltage of a low level (for example, 0V) at the high power mode. In this case, the switching transistor Q31 may be turned-off. This will be described with reference to FIG. 3.

The power mode voltage Vmode may become a voltage of a high level (for example, 3.3V) at the low power mode. In this case, the switching transistor Q31 may be turned-on. This will be described with reference to FIG. 4.

Figure 3:
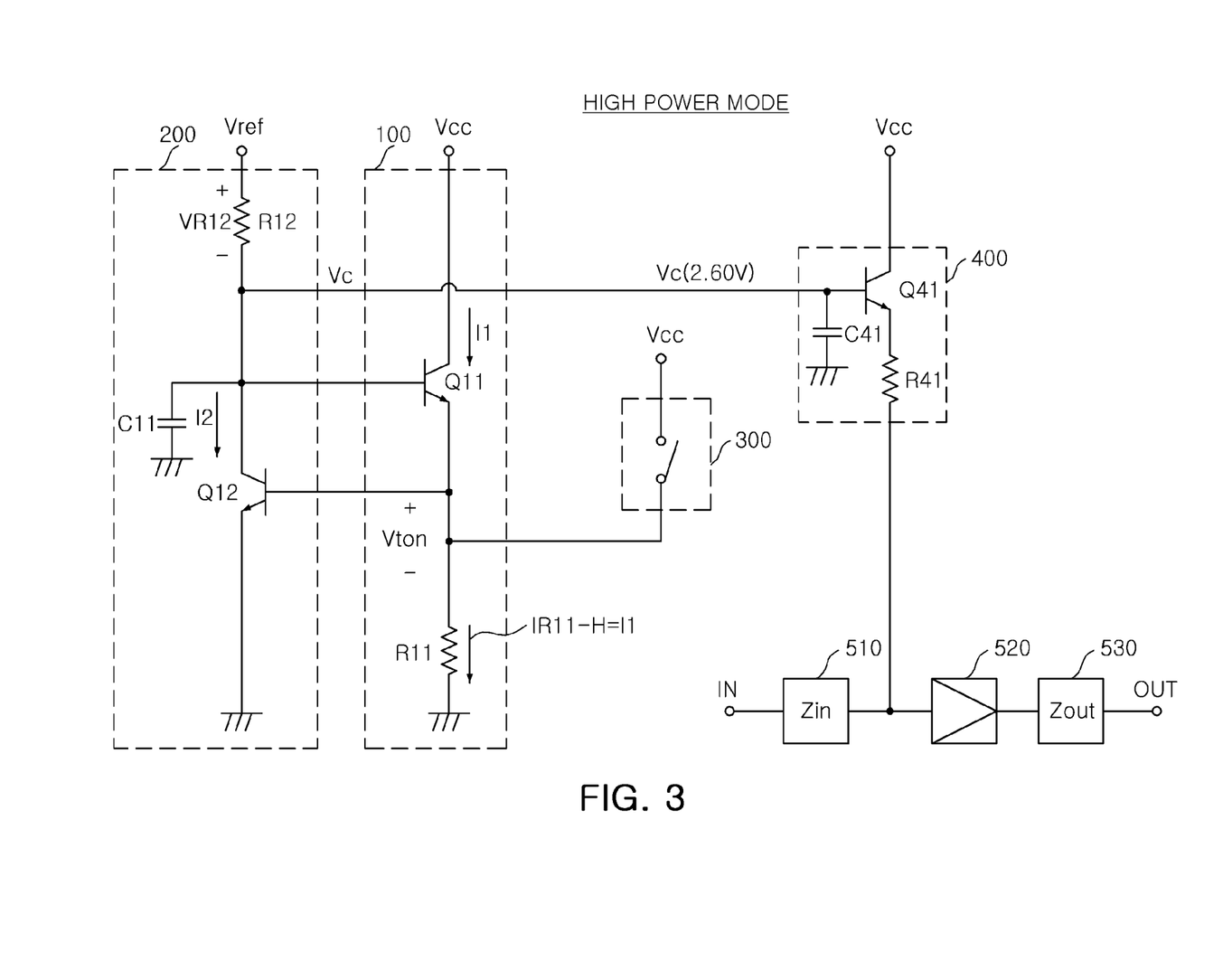
FIG. 3 is a diagram for illustrating an operation in a high power mode of the bias circuit and the power amplifier according to the embodiment of the present invention.

FIG. 3 is a diagram for illustrating an operation in a high power mode of the bias circuit and the power amplifier according to the embodiment of the present invention. Since the switching transistor Q31 of the power mode selecting unit 300 is turned-off at the high power mode, the additional current Iadd is not provided by the power mode selecting unit 300.

Referring to FIG. 3, the first temperature compensating transistor Q11 is turned-on by the reference voltage Vref, such that a first current I1 set by the operating voltage Vcc and the first resistor R11 becomes a current IR11-H so as to flow in the first resistor R11, and a voltage across the first resistor R11 is provided to the base of the second temperature compensating transistor Q12 as the turn-on voltage Vton.

Next, the second temperature compensating transistor Q12 is turned-on. In this case, the reference voltage Vref is applied across the second resistor R12 except for a collector to emitter voltage of the second temperature compensating transistor Q12.

Referring to FIGS. 2 and 3, the turn-on voltage, a voltage across the first resistor R11 is equal to a base to emitter voltage Vbe2 of the second temperature compensating transistor Q12 of FIG. 2, and a collector to base voltage Vcb2 of the second temperature compensating transistor Q12 is equal to a base to emitter voltage Vbe1 of the first temperature compensating transistor Q11.

Therefore, the control voltage Vc corresponding to a voltage obtained by subtracting a voltage VR12 across the second resistor R12 from the reference voltage Vref may be provided at the collector of the second temperature compensating transistor Q12. For example, when the reference voltage Vref is 2.9 V and the voltage VR12 across the second resistor R12 is 0.3 V, the control voltage Vc may be 2.6 V.

Figure 4:
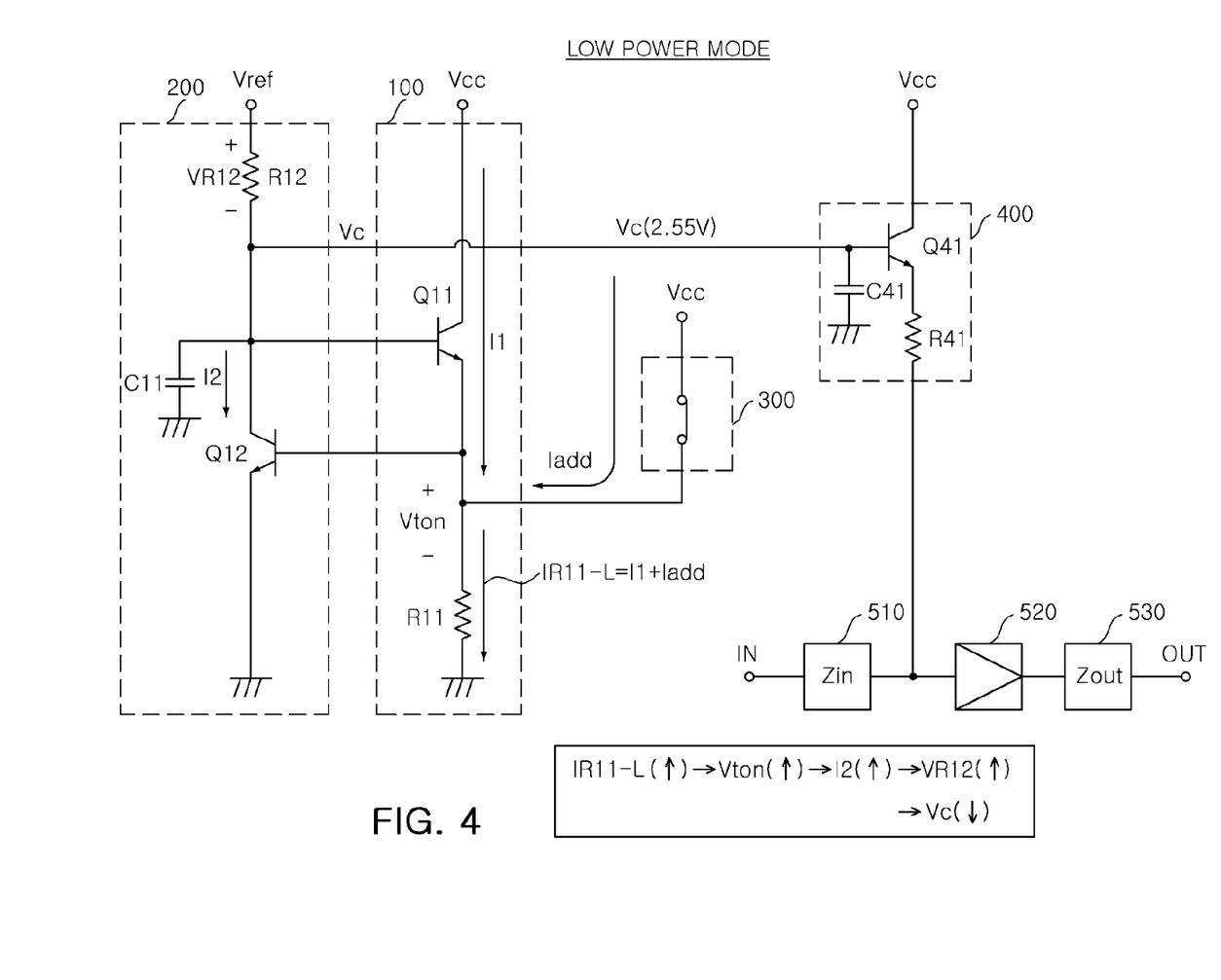
FIG. 4 is a diagram for illustrating an operation in a low power mode of the bias circuit and the power amplifier according to the embodiment of the present invention.

FIG. 4 is a diagram for illustrating an operation in a low power mode of the bias circuit and the power amplifier according to the embodiment of the present invention. Since the switching transistor Q31 of the power mode selecting unit 300 is turned-on at the low power mode, the additional current Iadd may be provided by the power mode selecting unit 300.

Referring to FIG. 4, the first temperature compensating transistor Q11 is turned-on by the reference voltage Vref, such that a first current I1 set by the operating voltage Vcc and the resistor from the operating voltage Vcc terminal to the ground flows in the first resistor R11, and the additional current Iadd also flows in the first resistor R11 by the power mode selecting unit 300. As a result, a current IR11-L flowing in the first resistor R11 becomes a current adding the first current I1 to the additional current Iadd.

Therefore, the turn-on voltage Vton, a voltage across the first resistor R11 is increased by the additional current Iadd so as to be provided to the base of the second temperature compensating transistor Q12, such that the second temperature compensating transistor Q12 is turned-on.

In this case, as the turn-on voltage Vton is increased, a second current I2 flowing through the second temperature compensating transistor Q12 is increased, such that the voltage VR12 across the second resistor R12 is increased.

As described above, since the control voltage Vc corresponds to the voltage obtained by subtracting the voltage VR12 across the second resistor R12 from the reference voltage Vref at the collector of the second temperature compensating transistor Q12, the control voltage Vc is decreased by the increased voltage VR12 across the second resistor R12. For example, when the reference voltage Vref is 2.9 V and the voltage VR12 across the second resistor R12 is 0.35V, then the control voltage Vc may be 2.55V.

Figure 5:
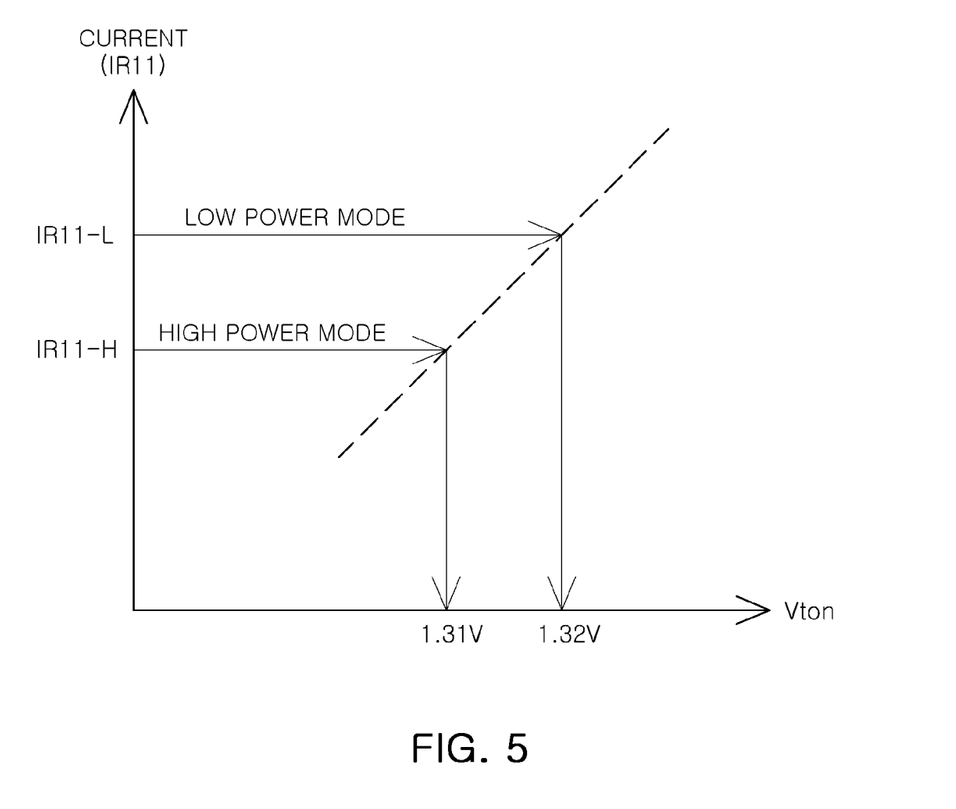
FIG. 5 is a IR11-Vton characteristic graph according to an embodiment of the present invention.
Figure 6:
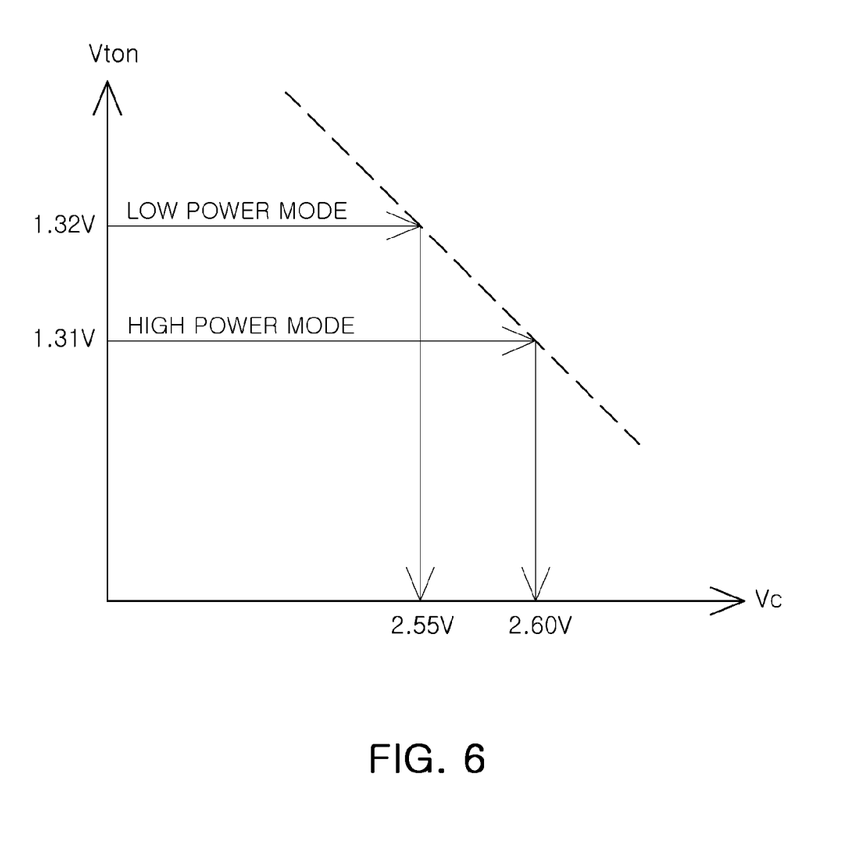
FIG. 6 is a Vton-Vc characteristic graph according to an embodiment of the present invention.

FIG. 5 is an IR11-Vton characteristic graph according to an embodiment of the present invention and FIG. 6 is a Vton-Vc characteristic graph according to an embodiment of the present invention.

Comparing the current and the voltage at the high power mode and the low power mode with reference to FIGS. 1 through 5, the current IR11-L flowing in the first resistor R11 at the low power mode is larger than the current IR11-H flowing in the first resistor R11 at the high power mode. Therefore, the turn-on voltage Vton, a voltage across the first resistor R11 at the low power mode may be higher than the turn-on voltage Vton at the high power mode.

For example, at the high power mode, the first current I1 is 115 µA like the current IR11-H flowing in the first resistor R11, and when the first resistor R11 has a resistance value of 11.4 KΩ, the turn-on voltage Vton becomes approximately 1.31V. At the low power mode, when the additional current Iadd is set to 1 µA by the power mode selecting unit 300, the current IR11-L flowing in the first resistor R11 may become 116 µA (115 µA(I1)+1 µA(Iadd)), and the turn-on voltage Vton may become 1.32V.

In addition, referring to FIGS. 1 through 6, in the high power mode, when the second current I2 flowing through the second temperature compensating transistor Q12 is 237 μA by the turn-on voltage Vton of 1.31 V and the second resistor R12 has a resistance value of 1.3 KΩ, the voltage VR12 across the second resistor R12 becomes 0.30 V, such that when the reference voltage Vref is 2.9 V, the control voltage Vc becomes 2.60 V.

In the low power mode, when the second current I2 flowing through the second temperature compensating transistor Q12 is 269 μA by the turn-on voltage Vton of 1.32 V and the second resistor R12 has a resistance value of 1.3 KΩ, the voltage VR12 across the second resistor R12 becomes approximately 0.35 V, such that when the reference voltage Vref is 2.9 V, the control voltage Vc becomes 2.55V.

As set forth above, according to the embodiment of the present invention, the low power mode suitable for the minimum output and the high power mode suitable for the maximum output are classified, such that the required mode between the high power mode and the low power mode may be selected, and the additional current is provided so as to drop the control voltage and the bias voltage at the time of selecting the low power mode, such that the power consumption may be decreased compared with the case used only at the maximum output, whereby usage efficiency may be improved.

While the present invention has been shown and described in connection with the embodiments, it will be apparent to those skilled in the art that modifications and variations can be made without departing from the spirit and scope of the invention as defined by the appended claims.

What is claimed is:

1. A bias circuit, comprising:
   a first temperature compensating unit connected between an operating voltage terminal and a ground and operating according to a reference voltage to generate a turn-on voltage;
   a second temperature compensating unit connected between a reference voltage terminal and the ground and operating according to the turn-on voltage to generate a control voltage;
   a power mode selecting unit selecting one of a high power mode and a low power mode according to a power mode voltage and providing an additional current to the first temperature compensating unit at the time of selecting the low power mode to increase the turn-on voltage; and
   a bias voltage generating unit generating a bias voltage according to the control voltage,
   wherein the control voltage and the bias voltage are decreased according to the increase in the turn-on voltage.

2. The bias circuit of claim 1, wherein the first temperature compensating unit includes:
   a first temperature compensating transistor having a collector connected to the operating voltage terminal, a base, and an emitter; and
   a first resistor connected between the emitter of the first temperature compensating transistor and the ground to provide the turn-on voltage.

3. The bias circuit of claim 2, wherein the second temperature compensating unit includes:
   a second resistor having one end connected to the reference voltage terminal and the other end connected to the base of the first temperature compensating transistor; and
   a second temperature compensating transistor having a collector connected to the other end of the second resistor, a base connected to the emitter of the first temperature compensating transistor to receive the turn-on voltage, and an emitter connected to the ground.

4. The bias circuit of claim 3, wherein the second temperature compensating unit further includes a capacitor connected between the collector of the second temperature compensating transistor and the ground.

5. The bias circuit of claim 2, wherein the power mode selecting unit includes:
   a switching transistor having a collector connected to the operating voltage terminal, a base receiving the power mode voltage, and an emitter; and
   a current adjusting resistor connected between the emitter of the switching transistor and the emitter of the first temperature compensating transistor to adjust the additional current.

6. The bias circuit of claim 3, wherein the bias voltage generating unit includes:
   a bias generating transistor having a collector connected to the operating voltage terminal, a base connected to the base of the first temperature compensating transistor, and an emitter connected to an output terminal of the bias voltage generating unit; and
   a capacitor connected between the base of the bias generating transistor and the ground.

7. A bias circuit, comprising:
   a first temperature compensating unit connected between an operating voltage terminal and a ground and operating according to a reference voltage to generate a turn-on voltage;
   a second temperature compensating unit connected between a reference voltage terminal and the ground and operating according to the turn-on voltage to generate a control voltage;
   a power mode selecting unit selecting one of the high power mode and a low power mode according to a power mode voltage; and
   a bias voltage generating unit generating a bias voltage according to the control voltage,
   wherein the power mode selecting unit separates a path of the additional current at the time of selecting the high power mode and connects the path of the additional current at the time of selecting the low power mode to thereby provide the additional current to the first temperature compensating unit to increase the turn-on voltage, and
   the control voltage and the bias voltage are decreased according to the increase in the turn-on voltage.

8. The bias circuit of claim 7, wherein the first temperature compensating unit includes:
   a first temperature compensating transistor having a collector connected to the operating voltage terminal, a base, and an emitter; and
   a first resistor connected between the emitter of the first temperature compensating transistor and the ground to provide the turn-on voltage.

9. The bias circuit of claim 8, wherein the second temperature compensating unit includes:
   a second resistor having one end connected to the reference voltage terminal and the other end connected to the base of the first temperature compensating transistor; and
   a second temperature compensating transistor having a collector connected to the other end of the second resistor, a base connected to the emitter of the first temperature compensating transistor to receive the turn-on voltage, and an emitter connected to the ground.

10. The bias circuit of claim 9, wherein the second temperature compensating unit further includes a capacitor connected between the collector of the second temperature compensating transistor and the ground.

11. The bias circuit of claim 8, wherein the power mode selecting unit includes:
- a switching transistor having a collector connected to the operating voltage terminal, a base receiving the power mode voltage, and an emitter; and
- a current adjusting resistor connected between the emitter of the switching transistor and the emitter of the first temperature compensating transistor to adjust the additional current.

12. The bias circuit of claim 9, wherein the bias voltage generating unit includes:
- a bias generating transistor having a collector connected to the operating voltage terminal, a base connected to the base of the first temperature compensating transistor, and an emitter connected to an output terminal of the bias voltage generating unit; and
- a capacitor connected between the base of the bias generating transistor and the ground.

13. A power amplifier, comprising:
- a first temperature compensating unit connected between an operating voltage terminal and a ground and operating according to a reference voltage to generate a turn-on voltage;
- a second temperature compensating unit connected between a reference voltage terminal and the ground and operating according to the turn-on voltage to generate a control voltage;
- a power mode selecting unit selecting one of a high power mode and a low power mode according to a power mode voltage and providing an additional current to the first temperature compensating unit at the time of selecting the low power mode to increase the turn-on voltage;
- a bias voltage generating unit generating a bias voltage according to the control voltage; and
- an amplifying unit receiving a bias voltage from the bias voltage generating unit to amplify power of a transmission signal,
- wherein the first temperature compensating unit provides the turn-on voltage temperature-compensated to compensate for a temperature change in the bias voltage generating unit and the second temperature compensating unit provides the control voltage temperature-compensated to compensate for a temperature change in the amplifying unit, and
- the control voltage and the bias voltage are decreased according to the increase in the turn-on voltage.

14. The power amplifier of claim 13, wherein the first temperature compensating unit includes:
- a first temperature compensating transistor having a collector connected to the operating voltage terminal, a base, and an emitter; and
- a first resistor connected between the emitter of the first temperature compensating transistor and the ground to provide the turn-on voltage.

15. The power amplifier of claim 14, wherein the second temperature compensating unit includes:
- a second resistor having one end connected to the reference voltage terminal and the other end connected to the base of the first temperature compensating transistor; and
- a second temperature compensating transistor having a collector connected to the other end of the second resistor, a base connected to the emitter of the first temperature compensating transistor to receive the turn-on voltage, and an emitter connected to the ground.

16. The power amplifier of claim 15, wherein the second temperature compensating unit further includes a capacitor connected between the collector of the second temperature compensating transistor and the ground.

17. The power amplifier of claim 15, wherein the power mode selecting unit includes:
- a switching transistor having a collector connected to the operating voltage terminal, abase receiving the power mode voltage, and an emitter; and
- a current adjusting resistor connected between the emitter of the switching transistor and the emitter of the first temperature compensating transistor to adjust the additional current.

18. The power amplifier of claim 15, wherein the bias voltage generating unit includes:
- a bias generating transistor having a collector connected to the operating voltage terminal, abase connected to the base of the first temperature compensating transistor, and an emitter connected to an output terminal of the bias voltage generating unit; and
- a capacitor connected between the base of the bias generating transistor and the ground.

19. The power amplifier of claim 18, wherein the amplifying unit includes an amplifying transistor having a base connected to an output node of the bias voltage generating unit through a bias resistor and receiving an input signal, a collector outputting an amplified signal, and an emitter connected to the ground, and
- the first temperature compensating transistor compensates for temperature characteristic of the bias generating transistor and the second temperature compensating transistor compensates for temperature characteristic of the amplifying transistor.

20. A power amplifier, comprising:
- a first temperature compensating unit connected between an operating voltage terminal and a ground and operating according to a reference voltage to generate a turn-on voltage;
- a second temperature compensating unit connected between a reference voltage terminal and the ground and operating according to the turn-on voltage to generate a control voltage;
- a power mode selecting unit selecting one of a high power mode and a low power mode according to a power mode voltage;
- a bias voltage generating unit generating a bias voltage according to the control voltage, and
- an amplifying unit receiving a bias voltage from the bias voltage generating unit to amplify power of a transmission signal,
- wherein the power mode selecting unit separates a path of the additional current at the time of selecting the high power mode and connects the path of the additional current at the time of selecting the low power mode to thereby provide the additional current to the first temperature compensating unit to increase the turn-on voltage, and
- the control voltage and the bias voltage are decreased according to the increase in the turn-on voltage.

21. The power amplifier of claim 20, wherein the first temperature compensating unit includes:
- a first temperature compensating transistor having a collector connected to the operating voltage terminal, a base, and an emitter; and
- a first resistor connected between the emitter of the first temperature compensating transistor and the ground to provide the turn-on voltage.

22. The power amplifier of claim 21, wherein the second temperature compensating unit includes:
- a second resistor having one end connected to the reference voltage terminal and the other end connected to the base of the first temperature compensating transistor; and
- a second temperature compensating transistor having a collector connected to the other end of the second resistor, a base connected to the emitter of the first temperature compensating transistor to receive the turn-on voltage, and an emitter connected to the ground.

23. The power amplifier of claim 22, wherein the second temperature compensating unit further includes a capacitor connected between the collector of the second temperature compensating transistor and the ground.

24. The power amplifier of claim 22, wherein the power mode selecting unit includes:
- a switching transistor having a collector connected to the operating voltage terminal, a base receiving the power mode voltage, and an emitter; and
- a current adjusting resistor connected between the emitter of the switching transistor and the emitter of the first temperature compensating transistor to adjust the additional current.

25. The power amplifier of claim 22, wherein the bias voltage generating unit includes:
- a bias generating transistor having a collector connected to the operating voltage terminal, a base connected to the base of the first temperature compensating transistor, and an emitter connected to an output terminal of the bias voltage generating unit; and
- a capacitor connected between the base of the bias generating transistor and the ground.

26. The power amplifier of claim 25, wherein the amplifying unit includes an amplifying transistor having a base connected to an output node of the bias voltage generating unit through a bias resistor and receiving an input signal, a collector outputting an amplified signal, and an emitter connected to the ground, and
   the first temperature compensating transistor compensates for temperature characteristic of the bias generating transistor and the second temperature compensating transistor compensates for temperature characteristic of the amplifying transistor.

27. A power amplifier, comprising:
- a first temperature compensating unit connected between an operating voltage terminal and a ground and operating according to a reference voltage to generate a turn-on voltage;
- a second temperature compensating unit connected between a reference voltage terminal and the ground and operating according to the turn-on voltage to generate a control voltage;
- a power mode selecting unit selecting one of a high power mode and a low power mode according to a power mode voltage;
- a bias voltage generating unit generating a bias voltage according to the control voltage, and
- an amplifying unit receiving a bias voltage from the bias voltage generating unit to amplify power of a transmission signal,
wherein the first temperature compensating unit provides the turn-on voltage temperature-compensated to compensate for a temperature change in the bias voltage generating unit and the second temperature compensating unit provides the control voltage temperature-compensated to compensate for a temperature change in the amplifying unit,
the power mode selecting unit separates a path of the additional current at the time of selecting the high power mode and connects the path of the additional current at the time of selecting the low power mode to thereby provide the additional current to the first temperature compensating unit to increase the turn-on voltage, and
the control voltage and the bias voltage are decreased according to the increase in the turn-on voltage.

28. The power amplifier of claim 27, wherein the first temperature compensating unit includes:
- a first temperature compensating transistor having a collector connected to the operating voltage terminal, a base, and an emitter; and
- a first resistor connected between the emitter of the first temperature compensating transistor and the ground to provide the turn-on voltage.

29. The power amplifier of claim 28, wherein the second temperature compensating unit includes:
- a second resistor having one end connected to the reference voltage terminal and the other end connected to the base of the first temperature compensating transistor; and
- a second temperature compensating transistor having a collector connected to the other end of the second resistor, a base connected to the emitter of the first temperature compensating transistor to receive the turn-on voltage, and an emitter connected to the ground.

30. The power amplifier of claim 29, wherein the power mode selecting unit includes:
- a switching transistor having a collector connected to the operating voltage terminal, a base receiving the power mode voltage, and an emitter; and
- a current adjusting resistor connected between the emitter of the switching transistor and the emitter of the first temperature compensating transistor to adjust the additional current.

31. The power amplifier of claim 30, wherein the bias voltage generating unit includes:
- a bias generating transistor having a collector connected to the operating voltage terminal, a base connected to the base of the first temperature compensating transistor, and an emitter connected to an output terminal of the bias voltage generating unit; and
- a capacitor connected between the base of the bias generating transistor and the ground.

32. The power amplifier of claim 31, wherein the amplifying unit includes an amplifying transistor having a base connected to an output node of the bias voltage generating unit through a bias resistor and receiving an input signal, a collector outputting an amplified signal, and an emitter connected to the ground, and
   the first temperature compensating transistor compensates for temperature characteristic of the bias generating transistor and the second temperature compensating transistor compensates for temperature characteristic of the amplifying transistor.

* * * * *